(12) United States Patent
Kudo et al.

(10) Patent No.: US 7,160,768 B2
(45) Date of Patent: Jan. 9, 2007

(54) METHOD OF MANUFACTURING ELECTRONIC DEVICE AND METHOD OF MANUFACTURING SEMICONDUCTOR DEVICE

(75) Inventors: Manabu Kudo, Chino (JP); Osamu Ohara, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/885,713

(22) Filed: Jul. 8, 2004

(65) Prior Publication Data

US 2005/0029593 A1    Feb. 10, 2005

(30) Foreign Application Priority Data

Jul. 10, 2003 (JP) ............................. 2003-195078
Jul. 22, 2003 (JP) ............................. 2003-199925
Feb. 24, 2004 (JP) ............................. 2004-048021

(51) Int. Cl.
*H01L 21/336* (2006.01)

(52) U.S. Cl. ........................ 438/197; 438/724

(58) Field of Classification Search ................ 438/197, 438/299, 624, 724, 744, 757
See application file for complete search history.

(56) References Cited

U.S. PATENT DOCUMENTS 5,620,910 A    4/1997    Teramoto

| 6,096,656 A * | 8/2000 | Matzke et al. .............. 438/702 |
| 6,342,133 B1 * | 1/2002 | D'Couto et al. ....... 204/192.17 |
| 6,458,715 B1 * | 10/2002 | Sano et al. .................. 438/773 |
| 2002/0149065 A1 * | 10/2002 | Koyama et al. ............ 257/389 |
| 2004/0018690 A1 * | 1/2004 | Muraoka ..................... 438/300 |
| 2004/0209482 A1 * | 10/2004 | Takahashi et al. .......... 438/765 |

FOREIGN PATENT DOCUMENTS

| EP | 0259826 A1 * | 3/1988 |
| JP | 55-145356 | 11/1980 |
| JP | A 8-254713 | 10/1996 |
| JP | A 2001-284342 | 10/2001 |
| JP | 2002-313806 | 10/2002 |
| JP | A 2003-008027 | 1/2003 |
| JP | 2003-197632 | 7/2003 |

* cited by examiner

*Primary Examiner*—T. N. Quach
(74) *Attorney, Agent, or Firm*—Oliff & Berridge, PLC

(57) ABSTRACT

The invention provides a semiconductor device, which removes troubles occurring when the parasitic capacitance between layered wiring lines with an interlayer insulating film therebetween is reduced, and have a simple structure and high reliability. The electronic device according to the invention can include a semiconductor layer formed on a substrate, a gate insulating layer formed on the semiconductor layer, a gate electrode having a predetermined pattern and formed on the gate insulating layer, an interlayer insulating film formed to cover the gate electrode, a source electrode and a drain electrode formed on the interlayer insulating film. The interlayer insulating film can be mainly made of silicon oxynitride with a nitrogen concentration of atomic percent or higher.

11 Claims, 6 Drawing Sheets

METHOD OF MANUFACTURING ELECTRONIC DEVICE AND METHOD OF MANUFACTURING SEMICONDUCTOR DEVICE

BACKGROUND OF THE INVENTION

1. Field of Invention

The present invention relates to a method of manufacturing an electronic device and a method of manufacturing a semiconductor device.

2. Description of Related Art

To realize large-scale integration (LSI) of electronic devices, such as semiconductor devices, wiring lines have recently become multi-layered. In electronic devices having such multi-layered wiring lines, upper and lower wiring patterns with an interlayer insulating film disposed therebetween are electrically connected to each other through contact holes formed in the interlayer insulating film.

Here, in order to reduce the parasitic capacitance between the wiring lines, there have been proposed various methods of selecting a material having a low dielectric constant for the interlayer insulating film, making the interlayer insulating film thick, etc. Generally, silicon oxide is used as the material for the interlayer insulating film. However, if a silicon oxide film is thickened, film stress becomes larger, thereby causing cracks. Further, if the thick interlayer insulating film is formed on the wiring lines having an acute shape, constrictions (overhangs) are generated in the interlayer insulating film corresponding to the acute shape, so that there arises a problem that the wiring lines formed thereon is likely to short-circuit. Therefore, in order to avoid the influence due to the constrictions generated when the interlayer insulating film is formed on the wiring lines having the acute shape, for example, Japanese Unexamined Patent Application Publication No. 55-145356 discloses technology that phosphate glass is formed on the interlayer insulating film and then the wiring lines are formed on the glass.

SUMMARY OF THE INVENTION

According to such technology disclosed above, short-circuiting which may be caused in wiring lines due to constrictions formed in the interlayer insulating film can be prevented or suppressed, but the parasitic capacitance between the wiring lines is not reduced. Also, the interlayer insulating film is formed to have a two-layered structure, so that it takes time to manufacture the interlayer insulating film, a stress based on the difference between the coefficients of thermal expansion of the layers is generated, and the film is peeled off.

An object of the invention is to provide an electronic device or a semiconductor device or a semiconductor device capable of reducing the parasitic capacitance between layered wiring lines with an interlayer insulating film disposed therebetween. More particularly the invention can provide a method of manufacturing an electronic device and a method of manufacturing a semiconductor, which sweeps away troubles which may occur when the parasitic capacitance is reduced, and have a simple structure and high reliability.

In order to solve the above problems, the invention can provide a method of manufacturing an electronic device including a step of forming a layered structure. The step of forming a layered structure can further include the steps of forming a first conductive layer having a predetermined pattern on a base, forming an insulating layer mainly made of silicon oxynitride with a nitrogen concentration of 2 atomic percent or higher on the first conductive layer, and forming a second conductive layer on the insulating layer. In the present specification, the mainly made of means including a component of the largest content among all components.

As a result of study, it has been found that a film stress generated when the insulating layer is thickened can be controlled by the components of the insulating layer. That is, as described above, when a thick insulating layer mainly made of silicon oxynitride (represented by the composition formula: $Si_xO_yN_z$, where x, y and z are natural numbers) with a nitrogen concentration of 2 atomic percent or higher between the first conductive layer and the second conductive layer is formed, it has been found that a film stress generated when the insulating layer is thickened is smaller than that of the conventional insulating layer.

Therefore, according to the method of manufacturing an electronic device of the invention, for example, even though a thick insulating layer is formed to reduce the parasitic capacitance between the conductive layers, the film stress can be decreased, thereby preventing or suppressing the generation of cracks in the insulating layer. Also, for example, even though the first conductive layer has an acute shape, the generation of constrictions in the insulating layer corresponding to the acute shape can be reduced and the short-circuiting hardly occurs in the second conductive layer formed on the insulating layer, thereby providing an electronic device with a high reliability.

Further, if annealing is performed after a stable insulating layer with few cracks is formed in such a state that the nitrogen concentration is relatively high, the nitrogen concentration of the insulating layer can be decreased. Consequently, the insulating layer can be thickened to reduce the parasitic capacitance between the conductive layers and the parasitic capacitance can also be reduced by the low dielectric constant due to a decrease in the nitrogen concentration of the insulating layer. That is, according to the method of manufacturing an electronic device of the invention, the insulating layer can be thickened without causing troubles occurring in the conventional method of manufacturing an electronic device, and the parasitic capacitance between the conductive layers can be decreased without lowering the reliability because the dielectric constant is lowered in the case where the insulating layer is annealed, thereby improving the reliability of the electronic device to be manufactured. Particularly, the problems such as the generation of cracks in the insulating layer or short-circuiting in the conductive layer due to the thickened insulating layer are completely solved, so that the parasitic capacitance between the conductive layers can be decreased without troubles. Thus, the manufacturing method of the invention can provide an electronic device with a high reliability, in which an insulating layer with a high barrier property, a good coverage shape, and a low film stress is disposed between the conductive layers.

In the manufacturing method of the invention, the annealing may include heat annealing based on heating, specifically, the annealing may be performed in a water vapor atmosphere, in an oxygen atmosphere, and in a hydrogen atmosphere. By performing such annealing, the nitrogen concentration of the insulating layer is lowered to 0.5 atomic percent or lower. In other words, according to the manufacturing method of the invention, after an insulating layer with a nitrogen concentration of 2 atomic percent or higher is formed, the annealing is performed under the conditions that the nitrogen concentration of the insulating layer is 0.5 atomic percent or lower.

Further, in the manufacturing method of the invention, the first conductive layer forming step may include the steps of forming a relatively low melting point conductive layer on the base, and forming a first relatively high melting point conductive layer on the low melting point conductive layer. In this case, for example, when the first conductive layer is formed to have a predetermined pattern by etching, the low melting point conductive layer is likely to become relatively narrowed by side-etching and the first high melting point conductive layer is likely to have an awning shape. Thus, in the case where a conventional insulating layer made of silicon oxide is formed so as to cover the first conductive layer, the above-mentioned constrictions are more likely to be generated. However, according to the manufacturing method of the present invention, even if the insulating layer is formed on the first conductive layer having such awning shape, a constriction is hardly generated, that is, constrictions are hardly generated because an insulating layer with a nitrogen concentration of 2 atomic percent or higher is formed. Specifically, for example, the low melting point conductive layer may comprise a layer mainly made of aluminum, and the high melting point conductive layer may comprise a layer mainly made of nitride.

Besides, for example, the first conductive layer forming step may include the steps of forming a first relatively high melting point conductive layer on the base, forming a relatively low melting point conductive layer on the first high melting point conductive layer, and forming a second relatively high melting point conductive layer on the low melting point conductive layer. The second relatively high melting point conductive layer has a melting point higher than that of the low melting point conductive layer. Moreover, the low melting point conductive layer may include a layer mainly made of aluminum, and the second high melting point conductive layer may include a layer mainly made of any one of high purity metal, metal nitride, and metal oxide. In any case, an awing shape is formed in the first conductive layer etching step, and an insulating layer for covering the first conductive layer includes a layer mainly made of silicon oxynitride with a nitrogen concentration of 2 atomic percent or higher, thereby preventing or suppressing the generation of the above-mentioned cracks.

Further, the insulating layer may be formed to be thicker than the first conductive layer during the insulating layer forming step. In this case, the insulating layer can be thickened to decrease the parasitic capacitance between the conductive layers is decreased. On the other hand, constrictions are likely to be generated as compared to the case that an insulating layer is thinner than the first conductive layer. However, the generation of constrictions is suitably prevented or suppressed because an insulating layer is mainly made of silicon oxynitride with a nitrogen concentration of 2 atomic percent or higher.

Moreover, the following structure obtained as an intermediate product in the manufacturing method of the invention may also be suitably used as an electronic device. That is, the invention can provide an electronic device having a first conductive layer having a predetermined pattern, an insulated layer formed so as to cover the first conductive layer, and a second conductive layer formed on the insulating layer. The insulating layer is mainly made of silicon oxynitride with a nitrogen concentration of 2 atomic percent or higher.

As described above, in the electronic device comprising an insulating layer mainly made of silicon oxynitride (represented by the composition formula: $Si_xO_yN_z$, where x, y and z are natural numbers) with a nitrogen concentration of 2 atomic percent or higher between the first and second conductive layers, a film stress generated when the insulating layer is thickened is relatively lower than that of the conventional electronic device. Hence, according to the above-mentioned electronic device, for example, even when the insulating layer is thickened to decrease the parasitic capacitance between the conductive layers, the film stress can be reduced, thereby preventing or suppressing the generation of cracks in the insulating layer. Further, for example, even when the first conductive layer has an acute shape, the generation of constrictions in the insulating layer corresponding to the acute shape is decreased, and the short-circuiting hardly occurs in the second conductive layer formed on the insulating layer.

In other words, according to the above-mentioned electronic device, since an insulating layer can be thickened without causing troubles occurring in the conventional electronic device, the parasitic capacitance between the conductive layers can be decreased, thereby farther enhancing the reliability of the electronic device. Particularly, the problems such as the generation of cracks in the insulating layer due to the thickened layer and the short-circuiting in the conductive layer due to the thickened layer are completely solved, so that the parasitic capacitance between the conductive layers can be decreased without troubles. Therefore, the invention can provide an electronic device with a high reliability, in which an insulating layer with a high barrier property, a good coverage shape, and a low film stress is disposed between the conductive layers. Moreover, in the above electronic device, the insulating layer may have a refractive index of 1.5 or higher (measured wavelength of 632 nm).

Further, in the above electronic device, the first conductive layer may have a layered structure having a low melting point conductive layer, and a first high melting point conductive layer. The first high melting point conductive layer may be arranged on the side of the insulating layer. In this case, for example, when the first conductive layer is formed to have a predetermined pattern by etching, the low melting point conductive layer is likely to become relatively narrowed by side-etching and the first high melting point conductive layer is likely to have an awning shape. Therefore, in the case where a conventional insulating layer made of silicon oxide is formed so as to cover the first conductive layer, the above-mentioned constrictions are more likely to be formed. However, in the structure of the above electronic device, even if the insulating layer is formed on the first conductive layer having such an awning shape, constrictions are hardly generated, that is, the parasitic capacitance between the conductive layers can be decreased. Thus, the insulating layer can be thickened without problems.

As a specific structure of the above first conductive layer, for example, the low melting point conductive layer may have a layer mainly made of aluminum, and the first high melting point conductive layer is made of any one of high purity metal, metal nitride, and metal oxide. Further, for example, the high melting point conductive layer, the low melting point conductive layer, and the second high melting point conductive layer may be layered in order on the insulating layer side. The second high melting point conductive layer may have a relatively higher melting point than that of the low melting point conductive layer. In any case, an awning shape is formed in the first conductive layer.

However, the insulating layer for covering the first conductive layer is mainly made of silicon oxynitride with a nitrogen concentration of 2 atomic percent or higher. Thus, the generation of the above-mentioned cracks is prevented or suppressed.

Further, in the above electronic device, the thickness of the insulating layer may be larger than the thickness of the first conductive layer. In this case, the insulating layer can be thickened to decrease the parasitic capacitance between the conductive layers. On the other hand, constrictions are likely to be generated as compared to the case that an insulating layer is thinner than the first conductive layer. However, the generation of constrictions is suitably prevented or suppressed because the insulating layer is mainly made of silicon oxynitride with a nitrogen concentration of 2 atomic percent or higher.

Next, in order to achieve the above object, the invention can provide a method of manufacturing a semiconductor device having a step of forming a layered structure. The step of forming the layered structure can include the steps of forming a semiconductor layer on a base, forming a gate insulating layer on the semiconductor layer, forming a gate electrode having a predetermined pattern on the gate insulating layer, forming an interlayer insulating layer mainly made of silicon oxynitride with a nitrogen concentration of 2 atomic percent or higher on the gate electrode, and forming a conductive layer on the interlayer insulating layer.

As described above, the interlayer insulating layer is mainly made of silicon oxynitride (represented by the composition formula: $Si_xO_yN_z$, where x, y and z are natural numbers) with a nitrogen concentration of 2 atomic percent or higher between the gate electrode and the conductive layer. As a result, a film stress generated when the interlayer insulating layer is thickened can be reduced. Hence, according to the method of manufacturing the semiconductor device of the invention, for example, even when the interlayer insulating layer is thickened to decrease the parasitic capacitance between the gate electrode and the conductive layer, the film stress can be reduced, and the generation of cracks in the interlayer insulating layer can be prevented or suppressed. Further, for example, even when the gate electrode has an acute shape, the generation of constrictions in the interlayer insulating layer corresponding to the acute shape is decreased, and the short-circuiting hardly occurs in the conductive layer formed on the interlayer insulating layer. Thus, the invention can provide a semiconductor device with a high reliability.

Further, if annealing is performed after a stable interlayer insulating layer with few cracks is formed in such a state that the nitrogen concentration is relatively high, the nitrogen concentration of the interlayer insulating layer can be decreased. Consequently, the insulating layer can be thickened to reduce the parasitic capacitance between the gate electrode and the conductive layers, and the parasitic capacitance can be reduced by the low dielectric constant due to a decrease in the nitrogen concentration of the interlayer insulating layer. In other words, according to the method of manufacturing a semiconductor device of the present invention, the interlayer insulating layer can be thickened without causing troubles occurring in the conventional method of manufacturing a semiconductor device, and because the dielectric constant is lowered by annealing of the interlayer insulating layer. Thus, the parasitic capacitance between the gate electrode and the conductive layers can be decreased without lowering the reliability, thereby further improving the reliability of a semiconductor device to be manufactured. Particularly, the problems, such as the generation of cracks in the interlayer insulating layer or short-circuiting in the conductive layer due to the thick interlayer insulating layer, are completely solved, so that the parasitic capacitance between the gate electrode and the conductive layers can be decreased without troubles. Thus, the manufacturing method of the invention can provide a semiconductor device with a high reliability, in which the interlayer insulating layer with a high barrier property, a good coverage shape, and a low film stress is disposed between the gate electrode and the conductive layer.

Further, in the manufacturing method of the invention, the annealing may include heat annealing based on heating, specifically, the annealing may be performed in a water vapor atmosphere, in an oxygen atmosphere, and in a hydrogen atmosphere. By performing such annealing, the nitrogen concentration is lowered to 0.5 atomic percent or lower. In other words, according to the manufacturing method of the invention, after an insulating layer with a nitrogen concentration of 2 atomic percent or higher is formed, the annealing is performed under the conditions that the nitrogen concentration is 0.5 atomic percent or lower.

Moreover, in the above manufacturing method of the semiconductor device, the gate electrode forming step may include the steps of forming a relatively low melting point layer, and forming a relatively high melting point layer on the low melting point layer. In this case, for example, when a gate electrode is formed to have a predetermined pattern by etching, the low melting point conductive layer is likely to become relatively narrowed by side-etching and the high melting point layer is likely to have an awning shape. Thus, in the case where a conventional interlayer insulating layer made of silicon oxide is formed so as to cover the gate electrode, the above-mentioned constrictions are more likely to be generated. However, according to the manufacturing of the invention, even if an interlayer insulating layer is formed on the gate electrode having such a awning shape, constrictions is hardly generated, that is, constrictions hardly occurs because an interlayer insulating layer with a nitrogen concentration of 2 atomic percent or higher is formed. Specifically, for example, a low melting point layer may include a layer mainly made of aluminum, and the high melting point layer may comprise a layer mainly made of metal nitride.

Further, in the interlayer insulating layer forming step, the thickness of the interlayer insulating layer may be larger than that of the gate electrode. In this case, the interlayer insulating layer is thickened to decrease the parasitic capacitance between the gate electrode and the conductive layer. On the other hand, constrictions are likely to be generated as compared to the case that an interlayer insulating layer is thinner than the gate electrode. However, the generation of constrictions is suitably prevented or suppressed because the interlayer insulating layer is mainly made of silicon oxynitride with a nitrogen concentration of 2 atomic percent or higher.

Moreover, in the semiconductor device manufactured by such a method, with each layer being layered along upper and lower directions, the interlayer insulating layer at the side of the gate electrode has a larger nitrogen content than the interlayer insulating layer on the gate electrode. Specifically, the interlayer insulating layer on the gate electrode has a nitrogen content of less than 0.5 atomic percent. On the other hand, the interlayer insulating layer at the side of the gate electrode has a nitrogen content of 0.5 atomic percent or higher, preferably, 2.0 atomic percent or higher. For example, such nitrogen contents can be measured using an elementary analysis (energy-dispersed type X-ray analysis, such as ESCA (electron spectroscopy for chemical analysis including SIMS (secondary ion mass spectrometry), AES (auger electron spectroscopy), XPS (X-ray photoelectron spectroscopy), etc.)).

Further, the semiconductor device of the present invention comprises a semiconductor layer formed on a base, a gate insulting layer formed on the semiconductor layer, a gate electrode formed on the gate insulating layer, and an interlayer insulating layer formed on the gate electrode, and a conductive layer formed on the interlayer insulating layer. At least the interlayer insulating layer at the side of the gate electrode is mainly made of silicon oxynitride with a nitrogen concentration of 2 atomic percent or higher. According to such a construction, the generation of constrictions is suitably prevented or suppressed. Further, the interlayer insulating layer formed between the gate electrode and the conductive layer is mainly made of silicon oxynitride with a nitrogen concentration of 0.5 atomic percent or lower. Consequently, the insulating layer can be thickened to reduce the parasitic capacitance between the gate electrode and the conductive layers, and the dielectric constant due to a decrease in the nitrogen concentration of the interlayer insulating layer can be lowered to reduce the parasitic capacitance. Further, in the semiconductor device of the present invention, the interlayer insulating layer formed between the gate electrode and the conductive layer may be mainly made of silicon oxynitride with a nitrogen concentration of 2 atomic percent or higher. The generation of constrictions can be more suitably prevented or suppressed by such a construction. The interlayer insulating layer other than at the side of the gate electrode may be mainly made of silicon oxynitride with a nitrogen concentration of 2 atomic percent or higher.

In this case, the interlayer insulating layer is mainly made of silicon oxynitride with a nitrogen concentration of 2 atomic percent or higher. Thus, even when the interlayer insulating layer is thickened to decrease the parasitic capacitance between the gate electrode and the conductive layer, the film stress generated in the interlayer insulating layer can be reduced, and the generation of cracks in the interlayer insulating layer can be prevented or suppressed. Further, for example, even when the gate electrode has an acute shape, the generation of constrictions in the interlayer insulating layer corresponding to the acute shape is also decreased. As a result, the short-circuiting hardly occurs in the conductive layer formed on the insulating layer so that a semiconductor device with a high reliability can be provided.

In other words, according to the above semiconductor device, the interlayer insulate layer can be thickened without causing troubles occurring in the conventional semiconductor device. Thus, the parasitic capacitance between the gate electrode and the conductive layers can be decreased without deteriorating the reliability, thereby further enhancing the reliability of the semiconductor device. Particularly, the problems, such as the generation of cracks in the interlayer insulating layer due to the thickened layer and the short-circuiting in the conductive layer due to the thickened layer are completely solved, so that the parasitic capacitance between the gate electrode and the conductive layers can be decreased without troubles. Accordingly, the invention can provide a semiconductor device with a high reliability, in which an interlayer insulating layer with a high barrier property, a good coverage shape, and a low film stress is disposed between the conductive layers. Moreover, in the above semiconductor device, the insulating layer may have a refractive index of 1.5 or higher.

Further, in the above semiconductor device, the gate electrode has a layered structure comprising a low melting point layer, and a high melting point layer. The high melting point layer is arranged on the side of the interlayer insulating layer. In this case, for example, when the gate electrode is formed to have a predetermined pattern by etching, the low melting point layer is likely to become relatively narrowed by side-etching and the high melting point layer is likely to have an awning shape. Thus, in the case where an interlayer insulating layer is formed so as to cover such the gate electrode, the above-mentioned constrictions are more likely to be generated. However, in the structure of the semiconductor device as described above, even if the interlayer insulating layer covers the gate electrode having such awning shape, constrictions are hardly generated, that is, the parasitic capacitance between the gate electrode and the conductive layers is decreased. Thus, the interlayer insulating layer can be thickened without problems.

As a specific structure of the gate electrode, for example, the low melting point layer can include a layer mainly made of aluminum, and the high melting point layer comprises a layer mainly made of metal nitride.

Also, for example, the high melting point layer, the low melting point layer, and the high melting point metal layer may be layered in order from the interlayer insulating layer side. Here, the high melting point metal layer has a melting point higher than that of the low melting point layer. In any case, an awning shaped is formed in the gate electrode. However, the interlayer insulating layer for covering the gate electrode is mainly made of silicon oxynitride with a nitrogen concentration of 2 atomic percent or higher. Thus, the generation of cracks as described above is prevented or suppressed.

Further, the thickness of the interlayer insulating layer may be larger than the thickness of the gate electrode. In this case, the interlayer insulating layer can be thickened to decrease the parasitic capacitance between the gate electrode and the conductive layers. On the other hand, constrictions are likely to be generated as compared to the case that an interlayer insulating layer is thinner than the gate electrode. However, the generation of constrictions is suitably prevented or suppressed because the interlayer insulating layer is mainly made of silicon oxynitride with a nitrogen concentration of 2 atomic percent or higher.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments according to the invention will now be described with reference to the accompanying drawings.

Figure 1:
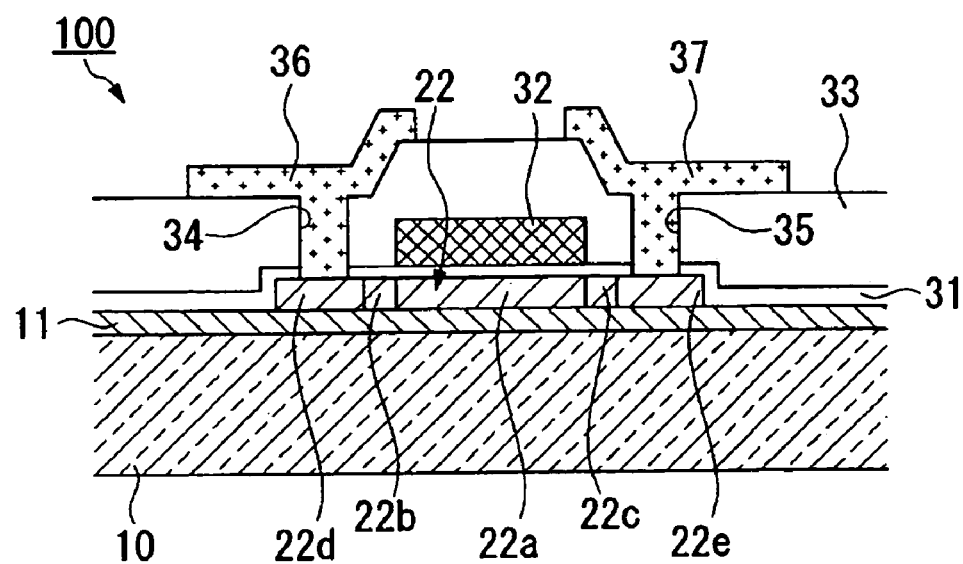
FIG. 1 is a schematic sectional view illustrating a semiconductor device according to an embodiment of the present invention.
Figure 2:
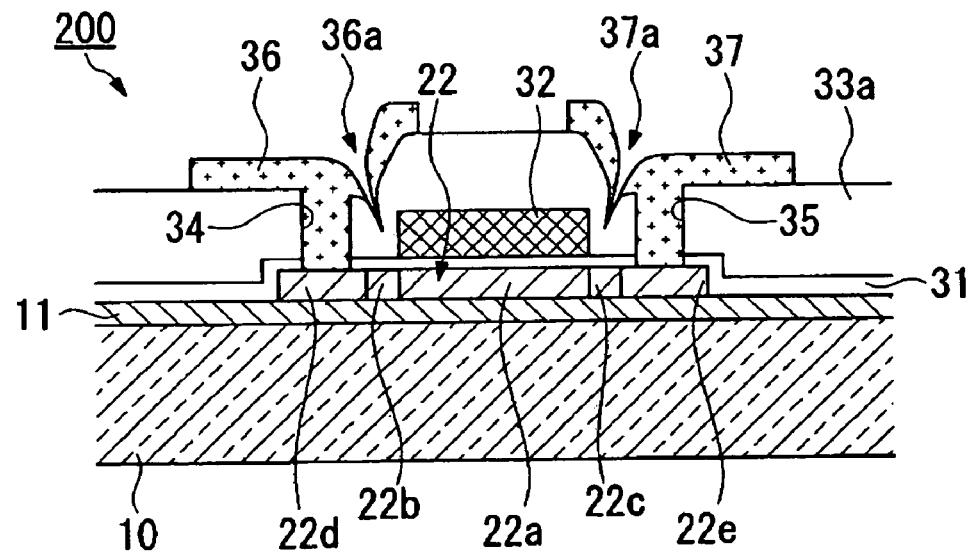
FIG. 2 is a schematic sectional view illustrating a semiconductor device according to a comparative example.

FIG. 1 is a schematic sectional view illustrating the schematic structure of a thin film transistor (a semiconductor device) as an embodiment of an electronic device obtained by a manufacturing method of the present invention; and FIG. 2 is a schematic sectional view illustrating the schematic structure of a semiconductor device of a comparative example. In addition, it should be understood that scales of respective layers and members in the respective drawings are made different from each other so that the respective layers and members have sizes capable of being recognized in the drawings.

As illustrated in FIG. 1, a thin film transistor (TFT) 100 is an N-channel type polycrystalline silicon TFT having a polycrystalline silicon film 22 formed on a glass substrate (base) 10 via a base protective film 11. The polycrystalline silicon film 22 can include a high concentration source region 22*d*, a low concentration source region 22*b*, a channel region 22*a*, a low concentration drain region 22*c*, and a high concentration drain region 22*e*.

A source electrode 36 is electrically connected to the high concentration source region 22*d* via a contact hole 34, and a drain electrode 37 is electrically connected to the high concentration drain region 22*e* via a contact hole 35. Further, a gate electrode 32 is formed on the channel region 22*a* of the polycrystalline silicon film 22 via a gate electrode 31. Such TFT 100 is suitable as a pixel switching element of, for example, an electroluminescent device used as a representative liquid crystal display (LCD) In this case, the drain electrode 37 is employed as a pixel electrode.

Here, the source electrode 36 and the drain electrode 37 are opposed to each other with respect to the gate electrode 32, with an interlayer insulating film 33 therebetween. Therefore, parasitic capacitance is generated between the opposed electrodes 36 and 37, and the parasitic capacitance may deteriorate the properties of the transistor. In order to decrease the parasitic capacitance, for example, it is effective that the interlayer insulating film 33 arranged between the source electrode 36 and the gate electrode 32 and between the drain electrode 37 and the gate electrode 32 is thickened.

Thus, for example, as shown in FIG. 2, when an interlayer insulating film 33*a* mainly made of silicon oxide that is conventionally used is thickened, film stress is increased and a crack may occur in the interlayer insulating film 33*a*. Further, constrictions 36*a* and 37*a* may be generated in the interlayer insulating film 33*a* around the gate electrode 32 corresponding to a stepped shape due to the gate electrode 32. Thus, in the case where the constrictions 36*a* and 37*a* are generated in the interlayer insulating film 33*a*, a short circuit may occur in the source and drain electrodes 36 and 37 formed on the interlayer insulating film 33*a* along the constrictions 36*a* and 37*a*.

However, in the TFT 100 according to the embodiment, even though the interlayer insulating film 33 is thickened to decrease the parasitic capacitance between the electrodes, a large film stress is not largely generated in the interlayer insulating film 33 because the interlayer insulating film 33 is mainly made of silicon oxynitride with a nitrogen concentration of 2 atomic percent or higher. Further, when the interlayer insulating film 33 is formed on the gate electrode 32 having an acute shape, the generation of constrictions in the interlayer insulating film corresponding to the acute shape is reduced. Thus, the short-circuiting hardly occurs in the source and drain electrodes 36*a* and 37 formed on the interlayer insulating film 33*a*, thereby providing the TFT 100 having a high reliability.

Figure 3:
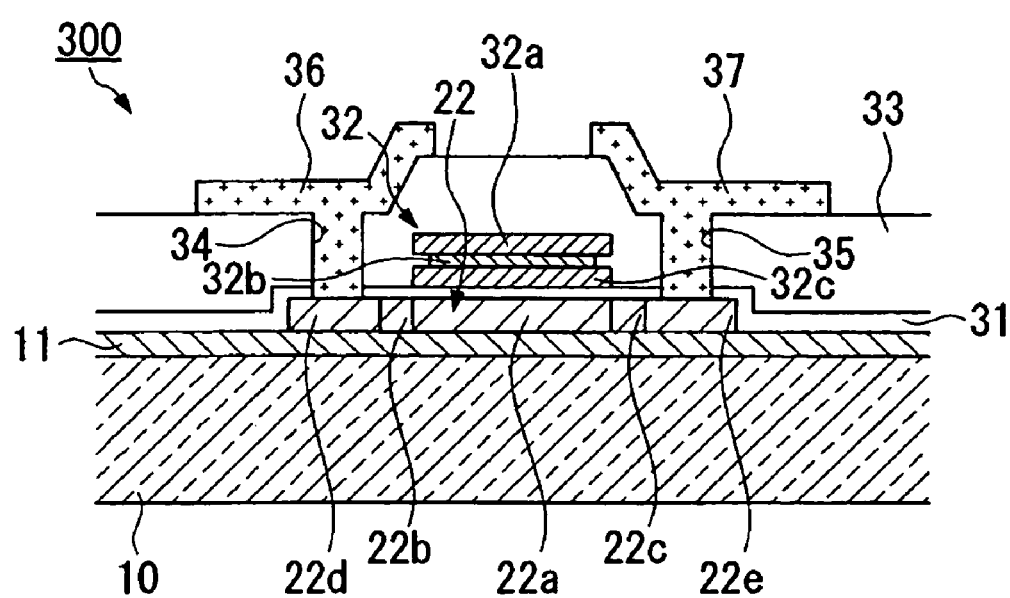
FIG. 3 is a schematic sectional view illustrating a modification of the semiconductor device in FIG. 1.

As shown in FIG. 3, in the case where the gate electrode 32 has a multi-layered structure including a plurality of layers that is different in their elements from each other, the above-mentioned constriction is more remarkably suppressed. Specifically, on the gate insulating film 31 are layered in order a relatively high melting point metal layer 32*c*, such as titanium, a low melting point metal layer 32*b* mainly made of aluminum, a high melting point metal layer 32*a* mainly made of metal nitride, such as titanium nitride. In this case, when the gate electrode 32 is etched to form a predetermined pattern, the low melting point metal layer 32*b* is likely to become relatively narrowed by side-etching. As a result, the high melting point metal layer 32*a* is likely to have an awning shape.

Here, the first and second high melting point metal layers may preferably employ tungsten, tantalum, molybdenum, or chrome other than titanium. More preferably, nitride or oxide of high melting point metal may be employed a film having the layered structure having the high melting point may be formed.

Thus, when the gate electrode 32 has the awning shape, the above-mentioned constriction is readily generated in the interlayer insulating layer 33. However, in the interlayer insulating film 33 according to the embodiment of the invention, even though the gate electrode 32 having the awning shape is covered with the interlayer insulating layer 33, a constriction is hardly generated, thereby preventing the source electrode 36 and the drain electrode 37 from short-circuiting, respectively.

Further, according to the embodiment, the thickness (e.g., 800 nm) of the interlayer insulating film 33 is larger than the thickness (e.g., 400 nm) of the gate electrode 32. That is, the interlayer insulating film 33 is thickened in order to decrease the parasitic capacitance between the electrodes. On the other hand, even though the interlayer insulating film 33 is thicker than the gate electrode 32 and thus constrictions are easily generated, such problem is solved by the interlayer insulating film 33 mainly made of silicon oxynitride with a nitrogen concentration of 2 atomic percent or higher.

The TFT 100 of the embodiment as described can be manufactured by, for example, the following processes. Hereinafter, a method of manufacturing the TFT 100 will be described with reference to FIGS. 4 to 6.

First, as shown in FIG. 4(*a*), a glass substrate 10 cleaned by ultrasonic cleaning is prepared. Under the conditions that the glass substrate 10 has a temperature of 150 to 450° C., the base protective film (shock-absorbing film) 11 formed of an insulating film, such as an silicon oxide film, is formed on the whole surface of the glass substrate 10. Specifically, the film formation is performed by a plasma chemical vapor deposition (CVD) method with a thickness of 10 µm or lower (e.g., about 500 nm). A source gas used in this process preferably includes a mixed gas of monosilane and nitrous oxide ($N_2O$), tetraethoxysilane (TEOS) Si ($OC_2H_5$), oxygen, disilane, ammonia, etc.

Next, as shown in FIG. 4(*b*), an amorphous silicon film (amorphous semiconductor film) 21 is formed by the plasma CVD method with a thickness of, for example, 30 to 100 nm on the entire surface of the glass substrate 10 having the base protective film 11 formed thereon under the conditions that the glass substrate 10 has a temperature of 150 to 450° C. A source gas used in this process preferably includes disilane or monosilane.

Figure 4A:
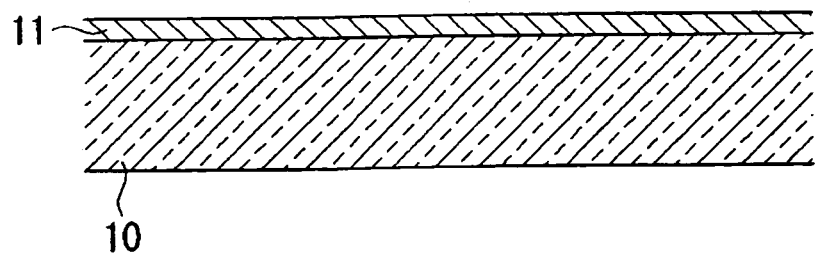
FIG. 4 is a sectional view schematically illustrating processes of manufacturing the semiconductor device in FIG. 1.
Figure 4B:
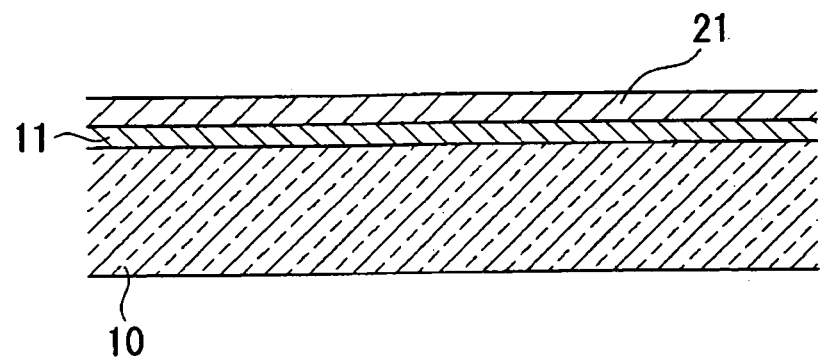
Figure 4C:
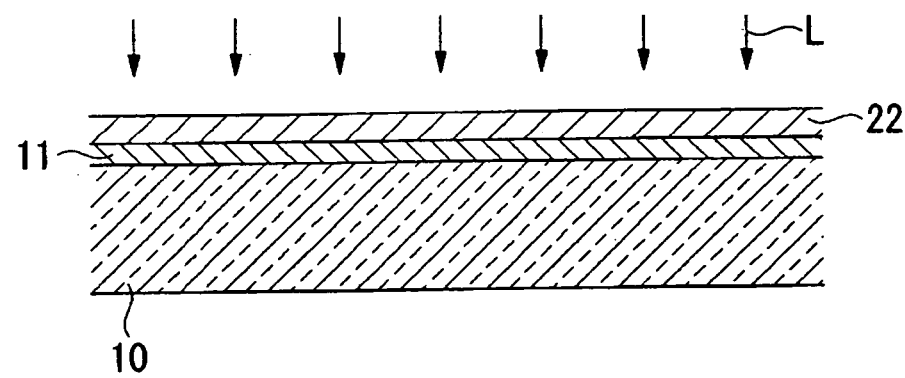

Next, as shown in FIG. 4(c), laser annealing is performed, that is, a polycrystalline silicon film 22 is formed by applying light "L" of an excimer laser to the amorphous silicon film 21, wherein an XeCl-excimer laser uses a wavelength of 308 nm and a KrF-excimer laser uses a wavelength of 249 nm.

Figure 4D:
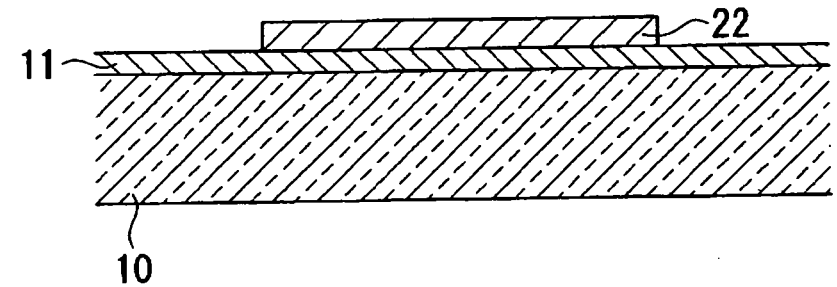

Next, as shown in FIG. 4(d), the polycrystalline silicon film 22 is patterned by photolithography into an active layer to be formed. That is, a photoresist is applied onto the polycrystalline silicon film 22, and then the photoresist is treated by exposure and development. Then, the polycrystalline silicon film 22 is etched and the photoresist is removed, thereby patterning the polycrystalline silicon film 22. Alternatively, after patterning the amorphous silicon film 21, the polycrystalline silicon film 22 may be formed by performing the laser annealing.

Figure 5A:
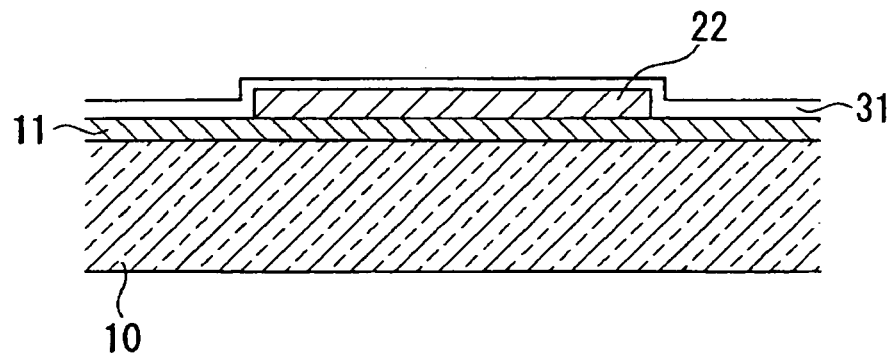
FIG. 5 is a sectional view schematically illustrating processes of manufacturing the semiconductor device, subsequent to the processes of FIG. 4.

Next, as shown in FIG. 5(a), a gate insulating film 31 a silicon oxide film and/or a silicon nitride film is formed with a thickness of 50 to 150 nm (in this embodiment, 50 nm) on the whole surface of the glass substrate 10 having the polycrystalline silicon film 22 formed thereon under a temperature of 350° C. or lower. A source gas used in this process preferably includes a mixed gas of tetraethoxysilane (TEOS) and oxygen gas, etc.

Figure 5B:
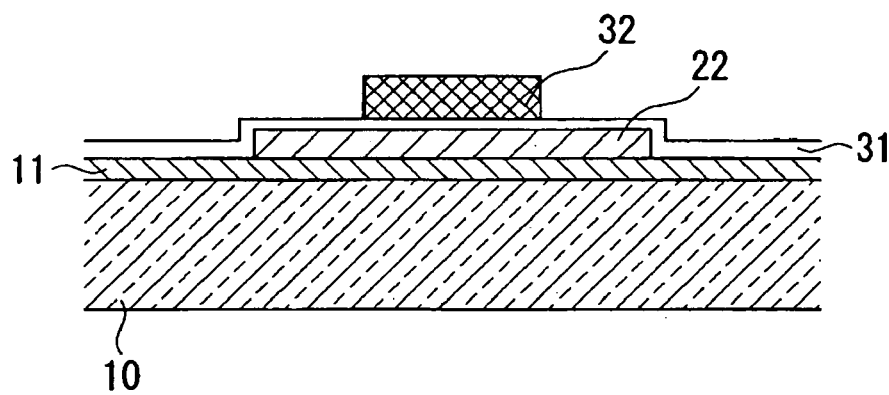

Next, as shown in FIG. 5(b), a conductive material including metal, such as aluminum, tantalum or molybdenum, or alloy mainly containing any one of them is formed by a sputtering method on the whole surface of the glass substrate 10 having the gate insulating film 31 formed thereon and is then patterned by the photolithography, thereby forming a gate electrode 32 having a thickness of 300 to 800 nm.

That is, a photoresist is applied onto the glass substrate 10 having a film of conductive material formed thereon, and is then treated by exposure and development. Then, the conductive material is etched and the photoresist is removed, thereby patterning the conductive material and forming the gate electrode 32.

Figure 5C:
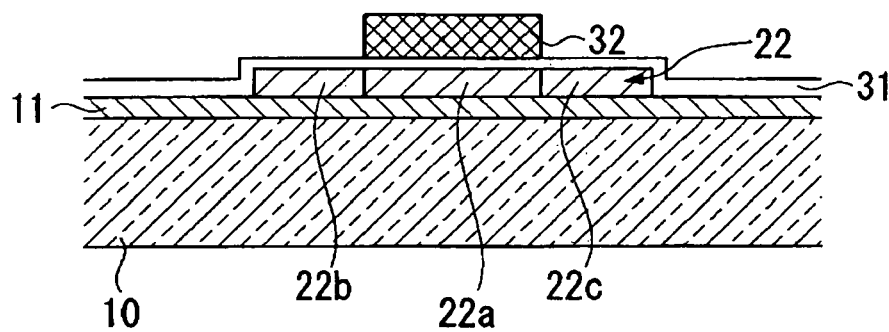

Next, as shown in FIG. 5(c), doping ions (e.g., phosphorus ions) of a low concentration is implanted with a dose of about $0.1 \times 10^{13}/cm^2$ to $10 \times 10^{13}/cm^2$ are toward the gate electrode 32 used as a mask, thereby forming a low concentration source region 22b and a low concentration drain region 22c in a self-aligned manner with respect to the gate electrode 32. Here, a portion disposed directly under the gate electrode 32 and having no doping ions introduced thereinto is a channel region 22a.

Figure 5D:
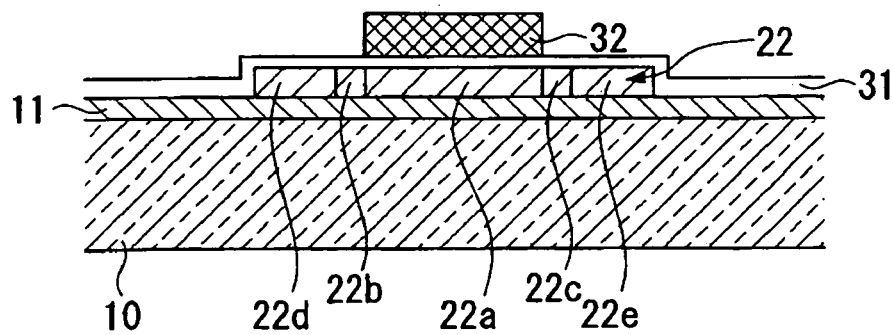

Further, as shown in FIG. 5(d), a resist mask (not shown) broader than the gate electrode 32 is formed, and then the doping ions (e.g., phosphorus ions) of a high concentration is implanted with a dose of about $0.1 \times 10^{15}/cm^2$ to $10 \times 10^{15}/cm^2$ toward the resist mask, thereby forming a high concentration source region 22d and a high concentration drain region 22e.

Figure 6A:
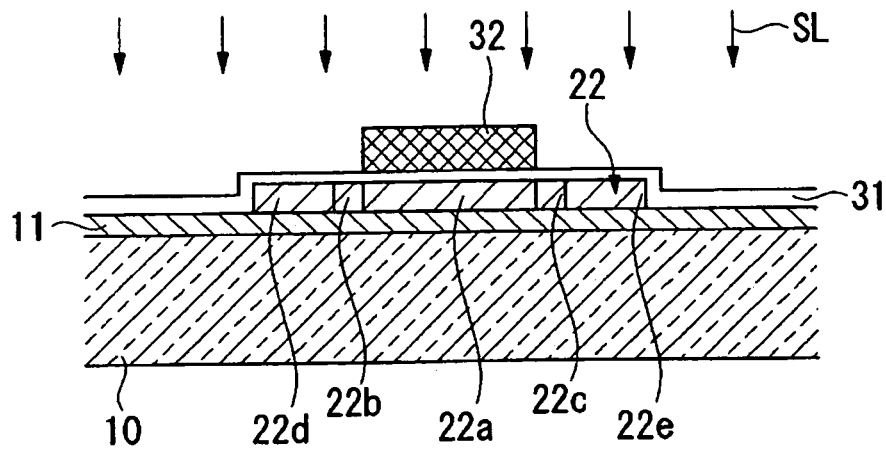
FIG. 6 is a schematic sectional view schematically illustrating processes of manufacturing the semiconductor device, subsequent to the processes of FIG. 5.

Next, as shown in FIG. 6(a), annealing is performed by radiating lamp light SL onto the glass substrate 10 having the polycrystalline silicon film 22 as shown in FIG. 5(d). Specifically, the excimer laser annealing is performed in a reduced pressure atmosphere or in a nitrogen atmosphere, thereby activating the dopant implanted into the source regions 22b and 22d and the drain regions 22c and 22e.

Figure 6B:
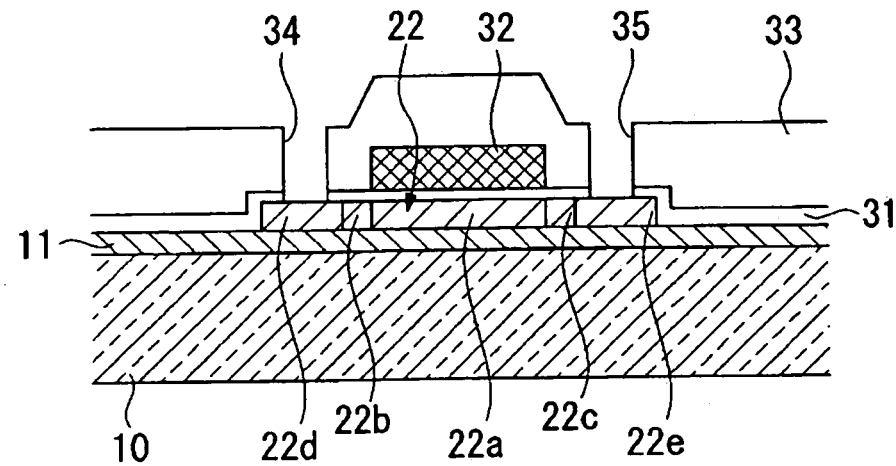

Next, as shown in FIG. 6(b), an interlayer insulating film 33 formed of a silicon oxynitride film is formed with a thickness of, for example, 400 to 900 nm by the CVD method on the upper surface (opposite to a surface facing the glass substrate 10) of the gate electrode 32. Specifically, a mixed gas of monosilane and nitrous oxide is used as a source gas and the flow ratios of the respective gases are appropriately set to obtain a silicon oxynitride film having a predetermined nitrogen concentration (in this embodiment, 2 atomic percent or higher). After the film is formed, the resist mask (not shown) having a predetermined pattern is formed, and then dry-etching is applied to the interlayer insulating film 33 through the resist mask. Thus, contact holes 34 and 35 are respectively formed in the portions of the interlayer insulating film 33 corresponding to the high concentration source region 22d and the high concentration drain region 22e.

Figure 6C:
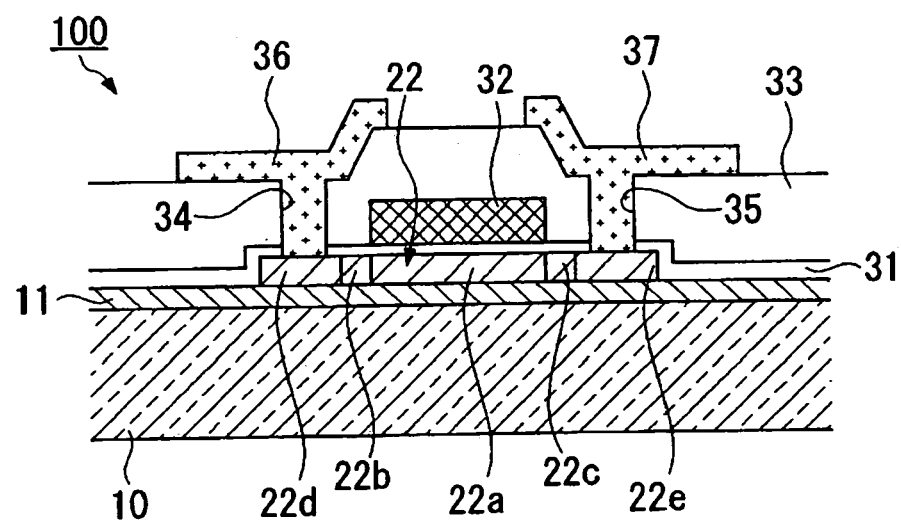

Next, as shown in FIG. 6(c), a film of conductive material including aluminum, titan, titan oxide, tantalum or molybdenum, or alloy mainly containing any one of them is formed by the sputtering method on the whole surface of the interlayer insulating film 33 having the gate insulating film 31 formed thereon, and is then patterned by the photolithography, thereby forming a source electrode 36 and a drain electrode 37 having a thickness of, for example, 400 to 800 nm. That is, a photoresist is applied onto the glass substrate 10 having a film of conductive material formed thereon, and is then treated by exposure and development. Then, the conductive material is etched and the photoresist is removed, thereby patterning the conductive material and forming a source electrode 36 and a drain electrode 37. As described above, an N-channel polycrystalline silicon TFT (semiconductor device) 100 can be manufactured.

Figure 7:
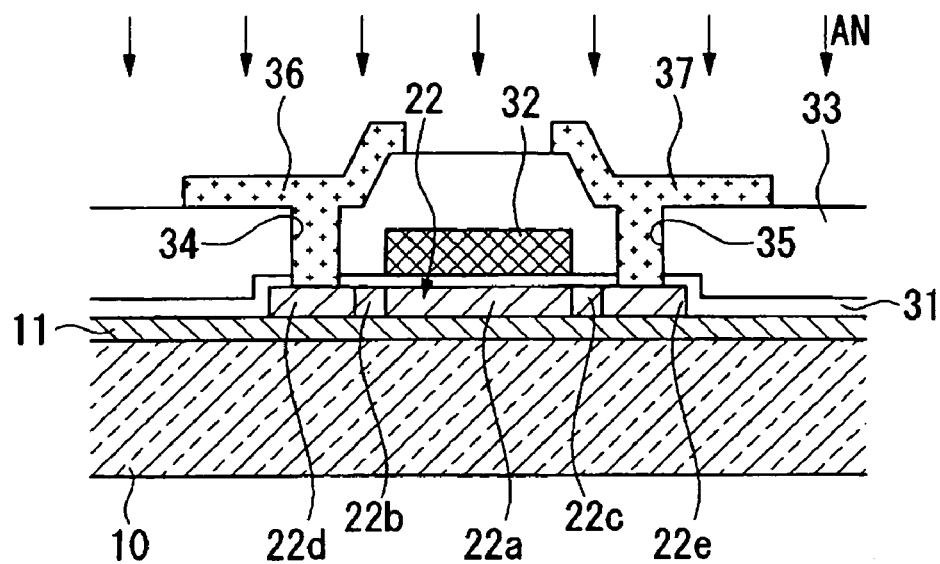
FIG. 7 is schematic sectional views illustrating a process of manufacturing the semiconductor device, following the process of FIG. 6.
Figure 8:
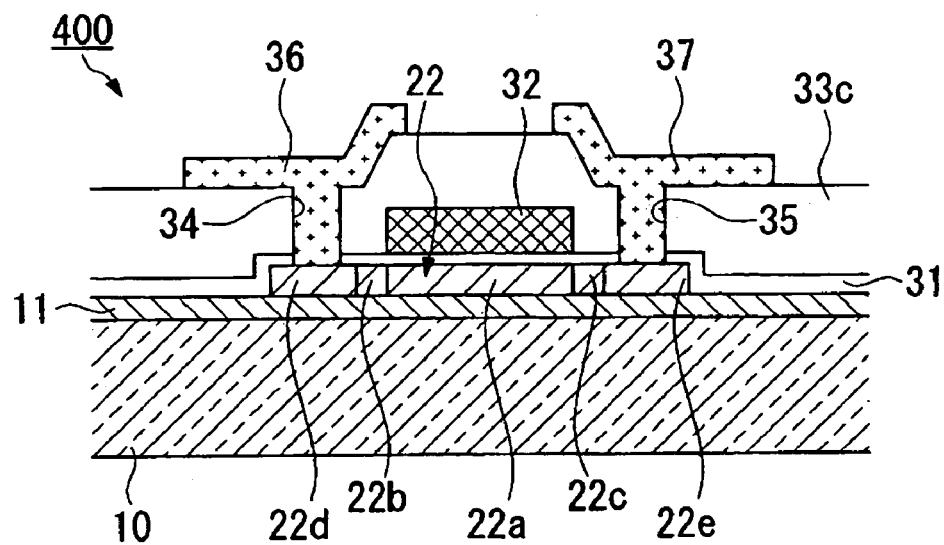
FIG. 8 is a sectional view schematically illustrating the structure of the semiconductor device after annealing.

The obtained TFT (semiconductor device) 100 may be, as shown in FIG. 7, treated by annealing (e.g., laser annealing) AN. Through the annealing AN, the nitrogen concentration of the interlayer insulating film 33 is lowered, specifically, an N-channel type polycrystalline silicon TFT 400 can be, as shown in FIG. 8, manufactured with an interlayer insulating film 33c with a nitrogen concentration of 0.5 atomic percent or lower. In this case, the annealing AN is preferably performed in a water vapor atmosphere, in an oxygen atmosphere, and in a hydrogen atmosphere. Further, if the interlayer insulating film (silicon oxynitride film) 33 is formed through the CVD at a temperature of, for example, about 300° C., and is treated by the annealing at a temperature of about 300° C., the film forming process and the annealing process of the interlayer insulating film 33 can be performed in the same chamber, thereby performing simple continuous processes, for example, by just changing inflowing gas.

From the manufacturing method including the annealing, the following effects are obtained. That is, in the manufacturing method according to the embodiment, when the interlayer insulating film 33 is formed, the silicon oxynitride film with a nitrogen concentration of 2 atomic percent or higher is formed, and is then treated by annealing, thereby decreasing the nitrogen concentration. Thus, problems (such as the generation of cracks or constrictions) occurring when the thick insulating film is formed can be solved, and the dielectric constant of the interlayer insulating film 33 can be lowered. That is, during the film forming process, as shown in FIG. 6(b), the interlayer insulating film 33 having a high nitrogen concentration is formed. Thus, a large film stress is not generated, and the generation of constrictions along the gate electrode 32 is reduced and the short-circuiting in the source and drain electrodes 36 and 37 formed on the insulating film 33 hardly occurs.

Besides, such an intermediate product allowing a film to be thickened is annealed, so that the nitrogen concentration is decreased, thereby further lowering the dielectric constant. Specifically, the annealing allows the nitrogen concentration to be lowered to 0.5 atomic percent, and allows the parasitic capacitance to be decreased. That is, the TFT (semiconductor device) 400 shown in FIG. 8 has the parasitic capacitance between the gate electrode 32 and the source electrode 36 (or the drain electrode 37) that is lower than the parasitic capacitance of the TFT (semiconductor device) 100 (refer to FIG. 6(c)) as an intermediate product, thereby improving reliability. Specifically, the insulating film 33 has a dielectric constant of about 4.6 to 4.9, whereas the annealed insulating film 33s has a dielectric constant of about 3.9 to 4.2. Meanwhile, according to the manufacturing method of the present embodiment, the nitrogen concentration in forming the insulating film 33 is increased. Thus, the polycrystalline silicon film 22 is hardly dehydrogenated during the annealing process, which makes it possible to perform the annealing efficiently.

Further, in the above-described manufacturing method, it is preferable that the interlayer insulating layer 33 at least at the side of the gate electrode 32 be mainly made of silicon oxynitride with a nitrogen concentration of 2 atomic percent or higher. By forming the interlayer insulating layer in this way, the above-described constrictions hardly occur: in other words, short-circuiting hardly occurs in the source electrode 36 and the drain electrode 37. Further, the interlayer insulating layer 33 between the gate electrode 32 and the source electrode 36 or drain electrode 37 may be an insulating layer having a nitrogen concentration of 0.5 atomic percent or lower with annealing. Thus, the parasitic capacitance between the gate electrode 32 and the source electrode 36 or drain electrode 37 can be reduced due to an increase in the thickness of the interlayer insulating layer 33 and the parasitic capacitance can also be reduced by the low dielectric constant due to a decrease in the nitrogen concentration of the interlayer insulating layer 33.

Further, the interlayer insulating layer 33 between the gate electrode 32 and the source electrode 36 or drain electrode 37 may be mainly made of silicon oxynitride with a nitrogen concentration of 2 atomic percent or higher. In other words, the annealing process may be performed, or otherwise the interlayer insulating layer 33 may be mainly made of silicon oxynitride with a nitrogen concentration of 2 atomic percent or higher.

Next, in order to make sure of the effects of the invention, the following evaluation was performed. That is, in the above-mentioned manufacturing method using the structure shown in FIG. 1, the flow ratio of monosilane and nitrous oxide when a interlayer insulating film 33 is formed is properly set so that TFTs according to Comparative Examples 1, 2 and 3 and Examples 1 and 2 are prepared to have the interlayer insulating film 33 having the nitrogen concentration (unit of N concentration: atomic percent) as shown in Table 1.

As to the TFTs according to Comparative examples 1, 2 and 3 and Examples 1 and 2, the refractive index of each interlayer insulating film 33, and short-circuiting rate (indicated as a relative value when the short-circuiting rate of Comparative example 1 is 1.0) in the source and drain electrodes 36 and 37, and the film stress (indicated as a relative value when the film stress of Comparative example 1 is 1.0) were evaluated. The results of evaluation are shown in Table 1.

TABLE 1

|  | N concentration | Refractive index | Short-circuiting rate | Film stress |
| --- | --- | --- | --- | --- |
| Comparative example 1 | 0.5 | 1.47 | 1.0 | 1.0 |
| Comparative example 2 | 1.0 | 1.48 | 0.7 | 0.5 |
| Comparative example 3 | 1.5 | 1.49 | 0.3 | 0.4 |
| Example 1 | 2.0 | 1.52 | 0.0 | 0.4 |
| Example 2 | 5.0 | 1.55 | 0.0 | 0.3 |

As described above, the short-circuiting rate and the film stress show different values depending on the nitrogen concentration (N concentration) of the interlayer insulating film 33. Specifically, in Comparative examples 1 to 3 respectively with a nitrogen concentration of 0.5 to 1.5 atomic percent, short-circuiting may occur, the film stress is large, and a crack in the interlayer insulating film 33 may be generated. On the other hand, in Examples 1 and 2 using the interlayer insulating film 33 respectively with a nitrogen concentration of 2 atomic percent or higher, short-circuiting is avoided and the film stress is reduced.

From the above results, the interlayer insulating film 33 is formed of silicon oxide with a nitrogen concentration of 2 atomic percent or higher when the interlayer insulating layer 33 is formed, thereby avoiding the problems such as short-circuiting, cracking, etc., which may occur when the thickness of the interlayer insulating layer 33 is increased. Accordingly, it can be understood that the parasitic capacitance between the gate electrode 32 and the source electrode 36 and between the gate electrode 32 and the drain electrode 37 can be decreased without trouble.

As described above, although one embodiment of the invention has been described, it should be understood that the invention is not limited thereto, but the invention covers the range easily replaceable from the respective claims by one skilled in the art without being limited to the definitions as set forth in the respective claims as long as it does not depart from the scope as set forth in the respective claims. A proper improvement can also be made to the invention on the basis of ordinary knowledge of a person skilled in the art. For instance, although the method of manufacturing an N-channel type TFT has been described as an example in the embodiment, the manufacturing method of the invention can also be applied to a method of manufacturing a P-channel type TFT. Further, an application of the invention is not limited to the TFT, and the structure of the invention may be employed in a general electronic device with an insulating layer interposed between a pair of electrodes.

Accordingly, while this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of manufacturing an electronic device, including a step of forming a layered structure, comprising the steps of:

forming a first conductive layer having a predetermined pattern above a base, the first conductive layer including a relatively low melting point conductive layer and first relatively high melting point conductive layer on the low melting point conductive layer;

forming an insulating layer mainly made of silicon oxynitride and having a nitrogen concentration of 2 atomic percent or higher on the first conductive layer;

forming a second conductive layer on the insulating layer; and forming the insulating layer to be thicker than the first conductive layer during the insulating layer forming step.

2. The method of manufacturing an electronic device according to claim 1, in addition to the layered structure forming step, the method further includes a step of annealing the formed layered structure.

3. The method of manufacturing an electronic device according to claim 2, the annealing including heat-annealing based on heating.

4. The method of manufacturing an electronic device according to claim 2, the annealing being performed in a water vapor atmosphere.

5. The method of manufacturing an electronic device according to claim 2, the annealing lowering the nitrogen concentration of the insulating layer to 0.5 atomic percent or lower.

6. The method of manufacturing an electronic device according to claim 1, the step of forming the first conductive layer further including the steps of:

forming a first relatively high melting point conductive layer on the base;

forming a relatively low melting point conductive layer on the first high melting point conductive layer; and forming a second relatively high melting point conductive layer on the low melting point conductive layer, and the second relatively high melting point conductive layer having a melting point higher than that of the low melting point conductive layer.

7. The method of manufacturing an electronic device according to claim 1, the low melting point conductive layer including a layer mainly made of aluminum, and the second high melting point conductive layer being a layer mainly made of any one of high purity metal, metal nitride, and metal oxide.

8. The method of manufacturing an electronic device according to claim 1, the insulating layer having a thickness of 800 nm and the first conductive layer having a thickness of 400 nm.

9. A method of manufacturing a semiconductor device including a step of forming a layered structure, comprising the steps of:

forming a semiconductor layer on a base;

forming a gate insulating layer on the semiconductor layer;

forming a gate electrode having a predetermined pattern on the gate insulating layer, the gate electrode including a relatively low melting point conductive layer and first relatively high melting point conductive layer on the low melting point conductive layer;

forming an interlayer insulating layer mainly made of silicon oxynitride and having a nitrogen concentration of 2 atomic percent or higher on the gate electrode;

forming a conductive layer on the interlayer insulating layer; and forming the interlayer insulating layer to be thicker than the gate electrode.

10. The method of manufacturing a semiconductor device according to claim 9, in addition to the step of forming the layered structure, the method further includes the step of annealing the layered structure.

11. The method of manufacturing a semiconductor device according to claim 9, the interlayer insulating layer having a thickness of 800 nm and the gate electrode having a thickness of 400 nm.

* * * * *